United States Patent [19]

Bernin

[11] Patent Number: 4,494,109
[45] Date of Patent: Jan. 15, 1985

[54] NONCONTACTING KEYBOARD EMPLOYING A TRANSFORMER ELEMENT

[76] Inventor: Victor M. Bernin, 105 E. Berkshire La., Mount Prospect, Ill. 60056

[21] Appl. No.: 229,175

[22] Filed: Jan. 28, 1981

Related U.S. Application Data

[63] Continuation-in-part of Ser. No. 946,346, Sep. 2, 1978, Pat. No. 4,300,127.

[51] Int. Cl.³ .............................................. G06F 3/02
[52] U.S. Cl. ................................ 340/365 L; 336/110; 336/130; 340/365 R; 340/365 S; 400/479.2
[58] Field of Search ............ 340/365 R, 365 L, 365 S; 178/17 C; 336/110, 130; 400/479.2; 200/82 E, 81.9 M, 83 L, 5 A; 365/62

[56] References Cited

U.S. PATENT DOCUMENTS

| | | | |
|---|---|---|---|
| 3,443,128 | 5/1969 | Fakan | 336/130 |
| 3,522,442 | 8/1970 | Wood | 340/365 L |
| 3,573,369 | 4/1971 | Konig et al. | 178/17 C |
| 3,612,241 | 10/1971 | Bernin | 340/365 L |
| 3,623,081 | 11/1971 | Scarbrough | 235/145 |
| 3,638,221 | 1/1972 | Bernin | 340/365 L |
| 3,638,222 | 1/1972 | Bernin | 340/365 L |
| 3,668,697 | 6/1972 | Cochran et al. | 340/365 L |
| 3,683,110 | 8/1972 | Shepard | 340/365 L |
| 3,683,371 | 8/1972 | Holz | 340/365 L |
| 3,698,531 | 10/1972 | Bernin | 340/365 L |
| 3,719,902 | 3/1973 | Esterly | 340/365 L |
| 3,740,746 | 6/1973 | Dureau et al. | 340/365 L |
| 3,745,536 | 7/1973 | Klehm | 364/200 |
| 3,765,014 | 10/1973 | Taylor | 340/365 L |
| 3,772,684 | 11/1973 | Scantlin | 340/365 L |
| 3,825,909 | 7/1974 | Engstrom et al. | 365/62 |
| 3,836,910 | 9/1974 | Bernin | 340/365 L |
| 3,918,051 | 11/1975 | Bernin et al. | 340/365 L |

FOREIGN PATENT DOCUMENTS

| | | |
|---|---|---|
| 1906117 | 8/1970 | Fed. Rep. of Germany. |
| 11690 | 5/1969 | Japan. |
| 21734 | 7/1970 | Japan. |
| 897957 | 6/1962 | United Kingdom. |

*Primary Examiner*—James J. Groody
*Attorney, Agent, or Firm*—Neuman, Williams, Anderson & Olson

[57] ABSTRACT

Noncontacting transformer switches are interconnected into keyboard networks which include insertable magnetic core, shorted turn or combination actuators. In a preferred embodiment, windings are provided and interconnected to form differential transformers. An actuator is inserted through one primary/secondary winding pair to switch the differential transformer between a balanced or "off" state and an unbalanced or "on" state. In one embodiment, single turn primary windings and their interconnecting network are printed on one side of a printed circuit board, and single turn secondary windings and their interconnecting network are printed in proper alignment on the opposite side of the board. A single hole aligned with a switched primary/secondary winding pair is provided for each transformer switch and actuators are arranged to be inserted through the holes. The transformer switches may be arranged to form a matrix array with the secondary windings connected to form a plurality of series connected winding rows and the primary windings connected to form a plurality of series connected winding columns. The printed wiring can be reduced for a given switch array by combining all nonswitched primary/secondary winding pairs into a single row of pairs which are differentially interconnected to the remaining rows of switched pairs. Keyboard touch control is provided by selectable amplifier driver power and threshold levels of comparators in keyboard scanner circuitry.

16 Claims, 15 Drawing Figures

NONCONTACTING KEYBOARD EMPLOYING A TRANSFORMER ELEMENT

BACKGROUND OF THE INVENTION

This application is a continuation-in-part of application Ser. No. 946,346 now U.S. Pat. No. 4,300,127 filed on Sept. 2, 1978 which is copending with this application.

This invention relates to a noncontacting keyboard employing a transformer switch and more particularly to a keyboard having a movable actuator for changing the mutual inductance in the primary and secondary windings of the transformer.

In the prior art, keyboards that were used for example in computers, computer terminals, calculators, control panels and telephone devices were of the mechanical types and more recently solid state noncontacting types. The mechanical types suffered from mechanical wear and corrosion of contacts which limited their useful life and reliability. The solid state types, which were generally of the electromagnetic, capacitive, photoelectric or Hall Effect types, suffer from various problems including high cost, marginal performance, power consumption, susceptibility to environmental factors, and reliability. The switch concept described in this application represents an advance in the art of keyboard switches in terms of improved performance and reliability, and reduced cost.

The prior art does not anticipate the structure, function or advantages of the instant invention. For example, in U.S. Pat. No. 3,668,697, the switch requires a network or element external to the switch to maintain its balance. Other patents which deal generally with keyboard switches but fail to teach the instant invention include U.S. Pat. Nos. 3,573,369; 3,740,746; 3,745,536 and certain of applicant's prior patents such as U.S. Pat. Nos. 3,612,241; 3,638,221; 3,638,222; 3,698,531; 3,825,909; 3,836,910 and 3,918,051.

SUMMARY OF THE INVENTION

The present invention comprises a transformer switch, a plurality of which can be connected into an X-Y switch matrix. In a preferred embodiment, each switch comprises a differential transformer. The advantages of this novel switch design are: simplicity, low cost, and high reliability. It is advantageous to construct the switch on a printed circuit board due to the high degree of transformer balance which can be maintained. Transformer balance insures good switch performance in terms of a high on/off ratio or dynamic range for the switch.

In the preferred embodiment, a keyboard comprises a matrix array of differential transformer switches with each switch comprising four identical printed circuit coils. A switch assembly is mounted over each crosspoint of the array with each switch assembly comprising a switch stem, a return spring, an actuator (magnetic core, shorted turn or a combination of the two) and a key top. When a switch assembly is depressed, the actuator is positioned in the center of a primary/secondary coil pair which comprises one half of a differential transformer switch element. The actuator changes the differential transformer between a balanced or switch "off" state and an unbalanced or switch "on" state. The two primary coils of the differential transformer element are connected in series opposing and the two secondary coils are connected in series aiding.

When a switch activating signal is applied to the primary coils of an undepressed switch, little if any of the activating signal is transmitted to the output terminals of the switch. The signals which appear on the secondary coils due to the activating signals are equal but opposite to one another since the differential transformer is in a balanced state. Accordingly, the signals on the secondary coils cancel each other and a negligible output signal is generated. Depressing the switch unbalances the transformer. In the unbalanced state, the signals which appear on the secondary coils are not equal but still opposite to one another. Accordingly, the signals on the secondary coils do not cancel and a signal is generated on the output terminals of the switch to indicate switch activation.

Printed circuit boards are a highly advantageous construction technique for switches in accordance with the present invention. The primary coils are printed on one side of a printed circuit board and the secondary coils are printed directly opposite on the other side of the board. A hole is provided through the board through the center of one primary/secondary pair of a differential transformer switch element for insertion of the switch actuator. The switch assemblies are then mounted directly over the holes so that the actuators can be selectively inserted into the holes by depressing the keytops. The secondary coils and the network which interconnects the secondary coils are printed on the printed circuit board by the same operation. The primary coils and their interconnecting network are printed on the opposite side of the board in the same manner.

In one keyboard embodiment, differential transformer switches are interconnected into an X-Y matrix array in which the primary coils are arranged into columns or drive lines along an X axis, and the secondary coils are arranged into rows or sense lines along a Y axis. This matrix can then be scanned by conventional means for encoding of switches and implementing various multi-key rollover circuits. When implementing an N-Key rollover circuit employing the differential transformer type switch, diodes for isolation purposes are not required as is often the case with this type circuit. The differential transformer switch is a self-contained and independent switch, and does not require another switch, external components or circuitry to maintain its balance or perform its switch function.

In a preferred keyboard embodiment of the present invention, all the primary/secondary coil pairs which are not switched, i.e., do not receive a switch actuator, are combined into a single row of coil pairs for an entire X-Y matrix array keyboard. A plurality of single turn primary coils are series connected into a plurality of columns. A plurality of single turn secondary coils are series connected into a plurality of rows with each row having two output terminals. A first output terminal of each row of secondary coils serves as an output for the row of secondary coils and the second output terminals of the rows are connected together. The bottom row of secondary coils has its first output terminal connected to ground so that all row output signals include a combination of the signal(s) on the given row with the signal(s) on the first row. Thus, the connections of the output terminals of the bottom row of secondary coils are such that those coils are differentially connected or poled opposite to the other rows of secondary coils.

Each primary coil is aligned with a secondary coil and all rows but the first row have a hole aligned with the primary/secondary transformer coils and actuators arranged to be inserted therein.

Keyboard "touch" control is incorporated into keyboards of the present invention by including means for varying the magnitude of a scan drive signal and/or a threshold of detection for associated output comparators. Such variations control the amount of actuator penetration into a primary/secondary coil pair required to activate the switch elements. Accordingly, the length of key stroke required to activate keys on the keyboard can be selectively controlled. The selective variations in the required length of keystroke coupled with the return spring provide a highly acceptable touch control for the keyboard.

BRIEF DESCRIPTION OF THE DRAWING

The invention will be better understood by reading the detailed description of the invention with reference to the drawing in which:

FIG. 10a shows the interconnection of the primary coils corresponding to the secondary coils of FIG. 9a;

DETAILED DESCRIPTION OF THE INVENTION

Basic Switch Element

The preferred basic switch element of the present invention is a differential electromagnetic transformer which can exist in either a balanced or an unbalanced state. The switch is so designed and structured that a switch actuation will result in changing the switch from a balanced "off" condition to an unbalanced "on" condition. The differential transformer consists of two identical simple transformers, i.e., a single primary winding and a single secondary winding transformer, with the primary windings interconnected in series opposing and the secondary windings interconnected in series aiding.

When the differential transformer switch is in a balanced condition, an excitation voltage applied to the primary windings of the differential transformer will essentially cancel out in the secondary windings so that little or no signal will be present on the output terminals of the transformer element. To unbalance the differential transformer, the electrical characteristics of one of the two simple transformers is modified, i.e., the coupling is either increased or decreased. If an excitation voltage is then applied to the input or primary windings, the signals on the secondary windings will not cancel out and an output signal will appear at the output terminals of the switch.

A differential transformer switch performs better than a simple transformer switch since a higher on/off ratio or dynamic range is possible. Such improved performance can be readily obtained when the switches are embodied on a printed circuit board since a high degree of differential transformer balance can be maintained with printed coils. The improved performance, together with the low cost of the printed circuit construction, results in a switch design that is relatively high in performance and low in cost.

Figure 1:
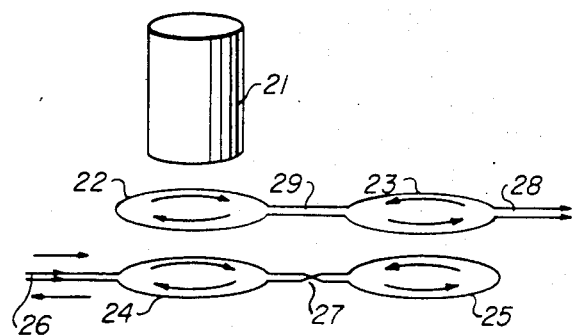
FIG. 1 shows a basic switch element using a ferrite core in the balanced or "off" state.

FIG. 1 shows a basic differential transformer switch element consisting of a movable ferrite magnetic core 21, two planar or flat primary coils 24 and 25 and two planar secondary coils 22 and 23. The two secondary coils 22 and 23 are connected in series aiding at 29 and the two primary coils 24 and 25 are connected in series opposing by means of a crossover 27. An excitation voltage is applied to the primary coils at 26 and an output signal, if any, will appear at the secondary coils at 28. Since the transformer is in a balanced state in FIG. 1, essentially no output signal is generated. FIG. 1 shows the switch in a balanced or "off" state because the core 21 is outside the coils 22 and 24 and accordingly, has no appreciable effect on the coupling between the coils 22 and 24.

Figure 2:
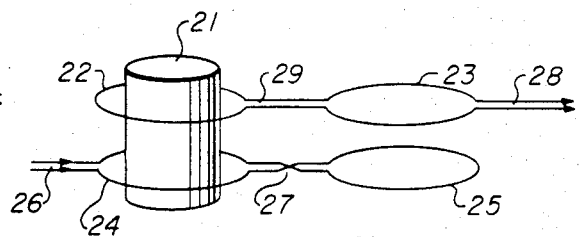
FIG. 2 shows a basic switch element in the unbalanced or "on" state.
Figure 3:
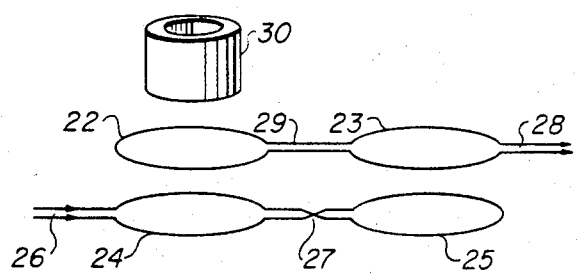
FIG. 3 shows a basic switch element using a shorted turn actuator in the balanced or "off" state.
Figure 4:
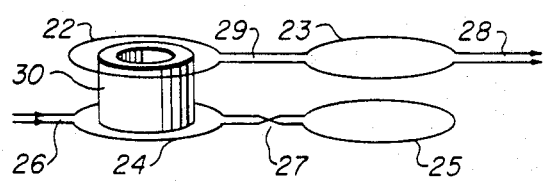
FIG. 4 shows a basic switch element using a shorted turn actuator in the unbalanced or "on" state.

FIG. 2 shows the switch in an unbalanced or "on" state since the core 21 is in the center of coils 22 and 24 magnetically linking these two coils, thereby increasing their mutual inductance and coupling. In FIG. 1, the voltages across each secondary coil are equal but of opposite phase and therefore the voltages cancel each other. In FIG. 2, the voltage across winding 22 has increased due to the increased coupling between windings 22 and 24, with the result that the two voltages across the secondary coils 22 and 23 do not cancel each other and a net voltage appears across the output terminals of the differential transformer at 28. FIGS. 3 and 4 show a similar switch configuration except the magnetic core 21 of the preceding views has been replaced by an electrically conducting shorted turn 30. The switch as shown in FIG. 3 is in a balanced state since the shorted turn 30 is outside the coils 22 and 24. The switch as shown in FIG. 4 is in an unbalanced state since the shorted turn 30 is inside the coils 22 and 24. In a shorted turn type switch an unbalanced condition is created by reducing the magnetic coupling between the two windings 22 and 24 rather than by increasing it. The disadvantage of the use of a shorted turn as compared to a magnetically permeable core such as a ferrite core is the lower magnitude of the output signal that results, all other conditions being equal.

Figure 5:
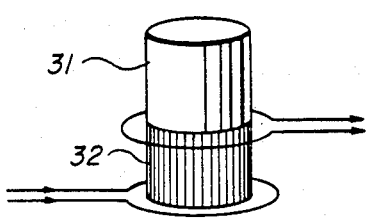
FIG. 5 shows a switch actuator which combines a magnetic core and a shorted turn.

FIG. 5 shows an alternate switch design which incorporates an actuator comprising a combined ferrite magnetic core 31 and a shorted turn 32. The advantage of this design is that the range of minimum to maximum coupling for a simple transformer is increased as it moves in and out of a primary/secondary pair of coils as compared to either a magnetic core or a shorted turn alone.

Figure 6:
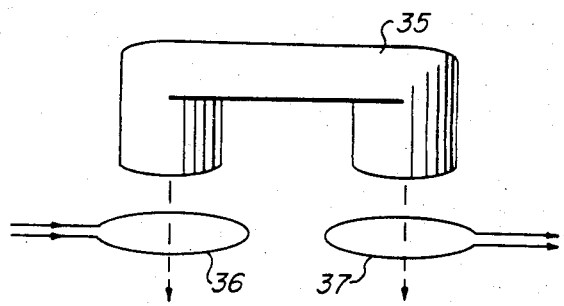
FIG. 6 shows a "U" shaped core actuator.

FIG. 6 shows a simple transformer switch element in which the primary coil 36 lies in the same plane as the secondary coil 37, and a "U" shaped core 35 provides coupling between the two coils. This design provides for minimum coupling between a primary and a secondary coil.

Interconnecting Network or Matrix

Figure 7:
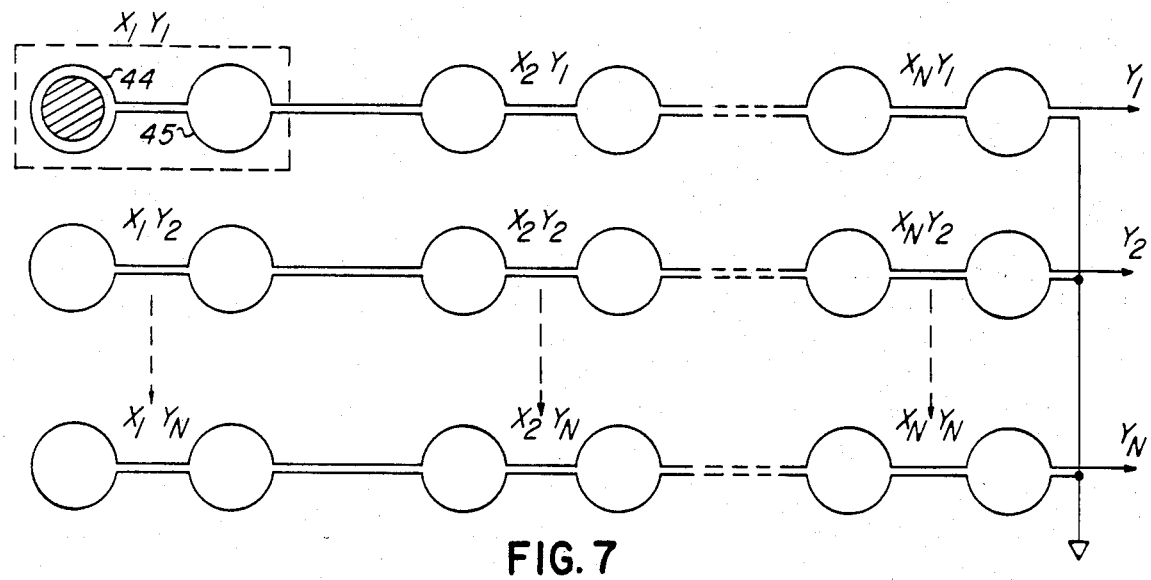
FIG. 7 shows the secondary coil interconnections of an X-Y matrix.
Figure 8:
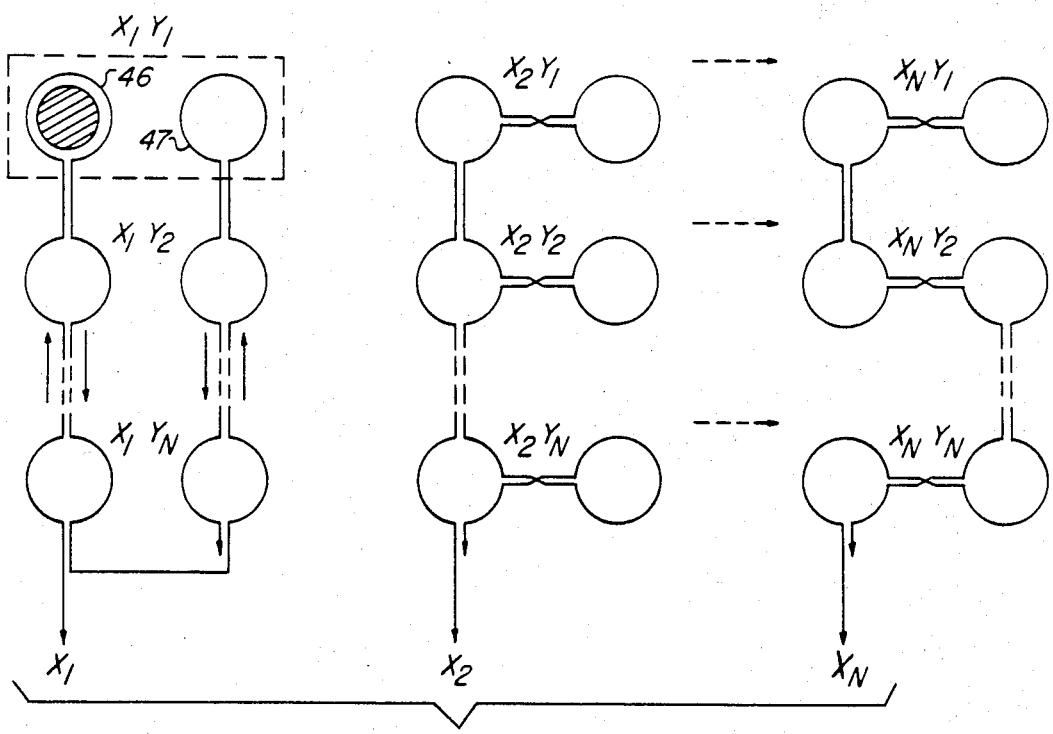
FIG. 8 shows the interconnection of the primary coils corresponding to the secondary coils of FIG. 7.

The differential transformer switch of the present invention is well adapted to various switch matrix designs including an X-Y type scanning matrix. This type matrix provides an efficient and effective means for encoding keyboard switches and providing various forms of multi-key rollover functions. FIG. 7 shows the manner in which the secondary coils are interconnected and arranged into rows or sense lines along a Y axis, and FIG. 8 shows how the corresponding primary coils are interconnected and arranged into columns or drive lines along an X axis. The circuit shown in FIG. 7 is superimposed on the circuit shown in FIG. 8, but separated by a non-conductive substrate or insulated board, such that the secondary coils are located on top of their corresponding primary coils, i.e., secondary coil 44 is located on top of primary coil 46 and secondary coil 45 is located on top of primary coil 47. This type structure is conveniently formed by printing the primary coils on one side of a printed circuit board and the secondary coils on the opposite side of the printed circuit board. The secondary coils in a given row or sense line are connected in series aiding and the primary coils in a given column or drive line are also connected in a series arrangement but with the currents in the primary coils of a given switch being oppositely phased. FIG. 8 shows several circuit configurations which will provide oppositely phased primary coil currents.

Figure 9:
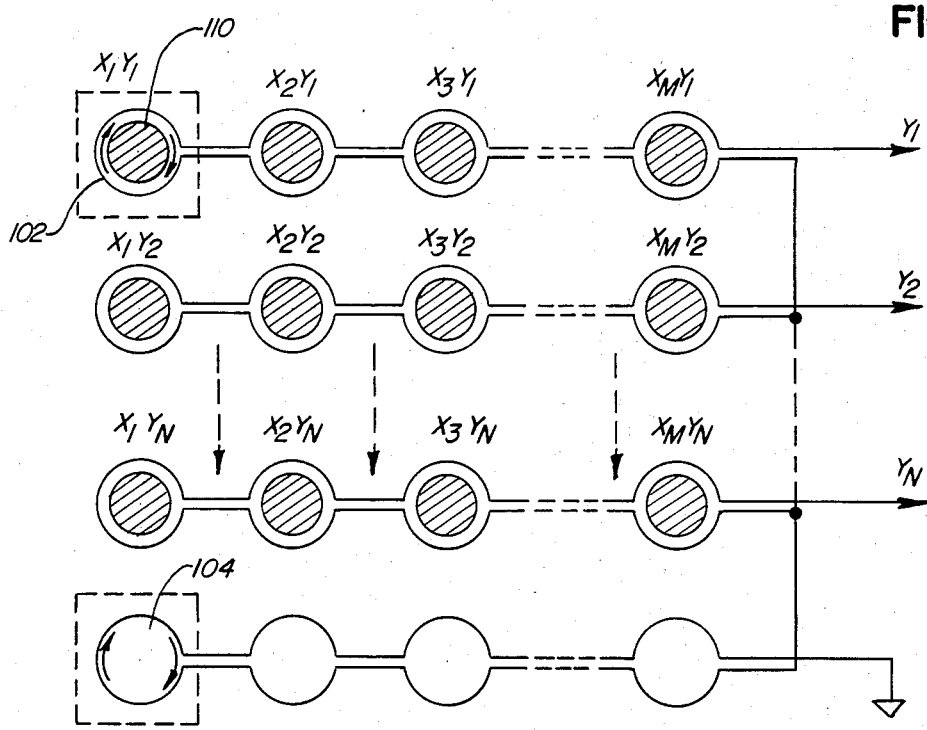
FIG. 9 shows the interconnection of the secondary coils of an X-Y matrix array in accordance with the preferred embodiment of the present invention.
Figure 10:
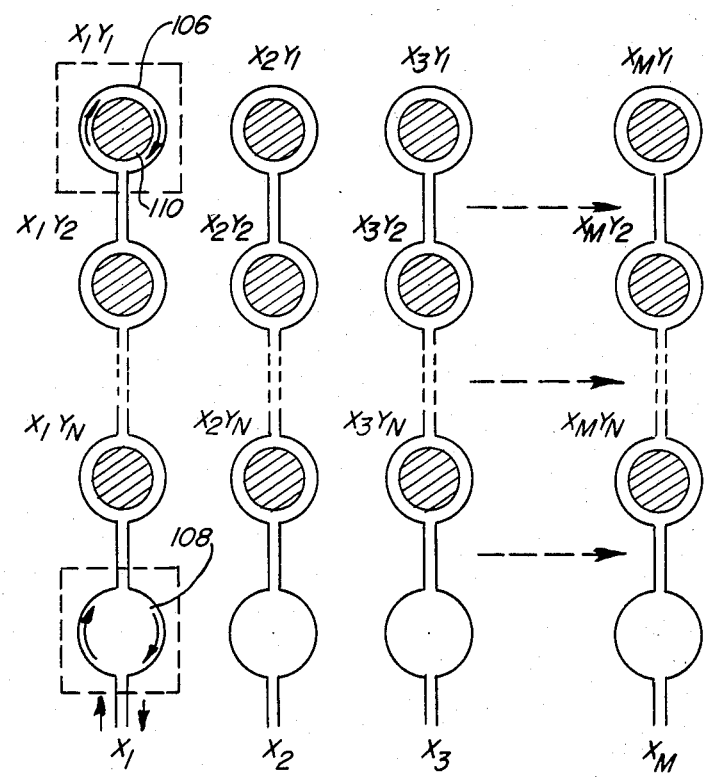
FIG. 10 shows the interconnection of the primary coils corresponding to the secondary coils of FIG. 9.

An improved X-Y type scanning matrix incorporating the differential transformer switch of the present application is shown in FIGS. 9 and 10. FIG. 9 shows the preferred manner in which the secondary coils are interconnected and arranged into rows or sense lines along a Y axis, and FIG. 10 shows how the corresponding primary coils are interconnected and arranged into columns or drive lines along an X axis. The circuit shown in FIG. 9 is superimposed on the circuit shown in FIG. 10 but separated by a non-conductive substrate or insulated board such that the secondary coils are located on top of their corresponding primary coils, e.g., secondary coil 102 is located on top of primary coil 106 and secondary coil 104 is located on top of primary coil 108. Again, this type matrix switch is conveniently produced by forming the primary coils on one side of a printed circuit board and the secondary coils on the opposite side of the printed circuit board.

The secondary coils in a given row or sense line are connected in series aiding and the primary coils in a given column or drive line are also connected in series aiding. The top terminal of each row of secondary coils as shown in FIG. 9 is brought out as a sense line and identified in FIG. 9 as $Y_1$ through $Y_N$. The lower conductors of each row of secondary coils are interconnected. The top conductor for the first row of secondary windings or bottom row as shown in FIG. 9 is connected to a reference potential such as ground.

The voltage signal present on any of the output lines is measured from that output line to the reference potential through the respective row of secondary windings and in a reverse direction through the first row of secondary windings as can be seen by the interconnection of the rows of secondary windings in FIG. 9. Thus, a driving voltage applied to a drive column, such as $X_1$ in FIG. 10, is coupled to the secondary windings 102 and 104 of FIG. 9 as well as the secondary windings therebetween. If the actuator 110 is not inserted within the primary/secondary coil combination 102 and 106, the voltages present on the coils 102 and 104 will be equal but oppositely phased and therefore, the output signal on $Y_1$ will be essentially 0 volts. However, if the actuator 110 is inserted within the primary/secondary winding pair 102 and 106, the voltage present on the secondary winding 102 will be greater (or less if a shorted turn actuator is used) than the voltage present on the secondary winding 104 and accordingly, a noticeable output signal will be present on the output $Y_1$. The voltage signals generated on the secondary coils intermediate the coils 102 and 106 of the first column do not effect the output signal on the conductor $Y_1$ since the output terminals $Y_1$ through $Y_N$ are connected to high input impedance sense amplifiers (see FIG. 13).

In the matrix arrangement illustrated in FIGS. 9 and 10, the differential or nonswitched primary/secondary coil pairs as shown in FIGS. 7 and 8 have been removed from the individual differential transformer switches and combined into a single row of differential primary/secondary coil pairs which is shown as the first row of the matrix and including primary coil 108 and secondary coil 104. The differential primary/secondary winding pairs which have been consolidated and shown as the bottom or first row of coils in FIGS. 9 and 10, are the simple transformers of the differential switches which are not controlled by a mutual inductance changing actuator. This arrangement considerably simplifies the matrix switch and the amount of printed circuitry required on a printed circuit board while maintaining the advantages of the differential switch element.

Figure 9A:
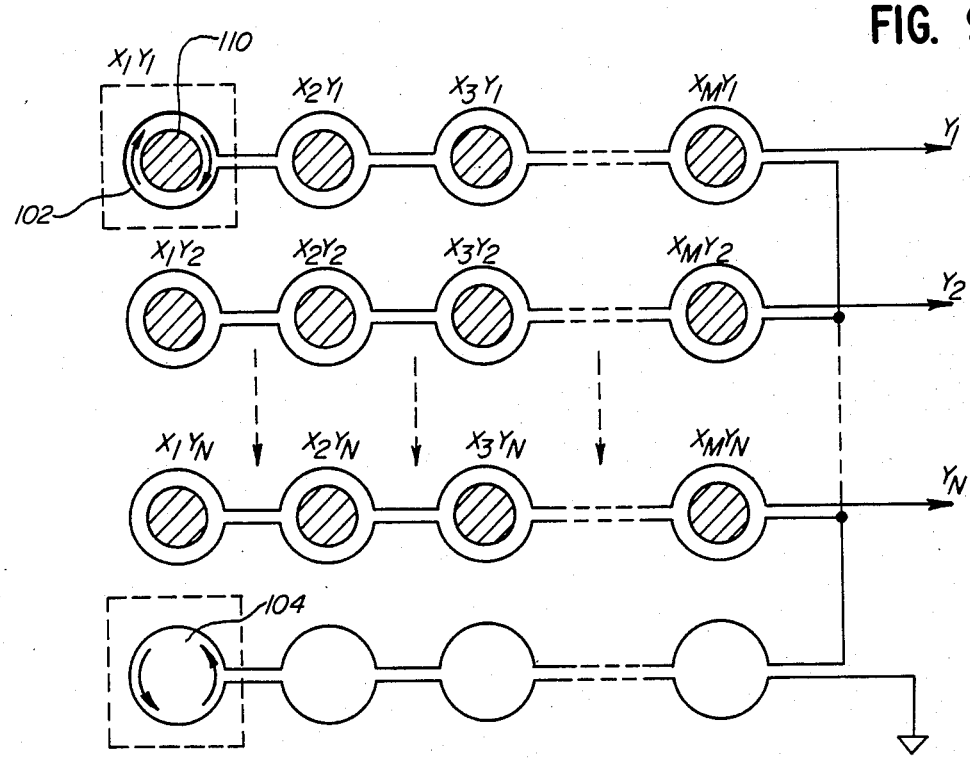
FIG. 9a shows the interconnection of the secondary coils of an X-Y matrix array in accordance with another embodiment of the present invention.
Figure 10A:
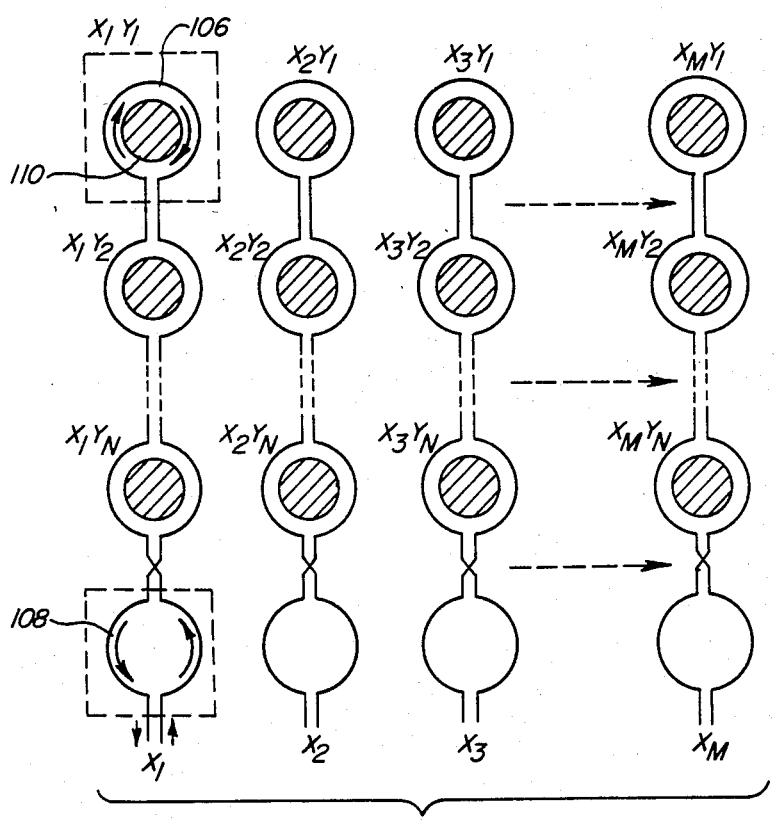

It is noted that the first row of primary/secondary winding pairs was selected for illustration purposes and that any row could be chosen for the differential primary/secondary coil pairs. Other configurations of the windings are also possible. For example, the primary windings comprising the first row of primary windings in FIG. 10 could be differentially connected to the remaining primary windings, as shown in FIG. 10a, so that the voltage induced into the secondary windings of the differential primary/secondary winding pairs would be oppositely poled to that shown by the arrows in secondary winding 104 of FIG. 9. In that case, the connections to the output of the first row of secondary windings in FIG. 9 is reversed, as shown in FIG. 9a; i.e., the bottom output connector is connected to ground and the top output conductor is connected to the bottom output conductors of the remaining rows of secondary windings. Here again, any row of primary windings can be reversed relative to the remaining primary winding rows and the differential primary/secondary winding pairs then correspond to that row. Of course the row which is selected as the differential primary/secondary winding pairs does not require actuators. Such a configuration requires a double reversal of the current flow paths in the primary winding columns and accordingly, requires more complex wiring. Although these and other embodiments which will be apparent to those of ordinary skill in the art require generally more complex circuit board paths, such alternative embodiments may be desirable for specific applications.

Construction of Transformer Coils and Interconnecting Network

The transformer coils and their interconnecting network are constructed in a planar form, i.e., the coils and network lie flat in a plane. The purpose of constructing these circuits in this manner is that it allows for very low cost fabrication techniques to be employed, principally printed circuit board and thick film screening techniques. An additional benefit from these techniques is that highly accurate and highly repeatable conductive patterns are provided which translates into highly balanced differential transformers and therefore switches with a high on/off signal ratio or dynamic range.

The primary and secondary circuits lie in separate but parallel planes and generally as close as possible to one another. In a double sided printed circuit board design, the primary and secondary circuit patterns are printed on opposite sides of the same board. Thick film screening techniques allow the two patterns to be screened on opposite sides of a board or on the same side. The paired primary and secondary coils lie on the same axis and holes are provided through the board centered on the paired coils as required for the insertion of magnetic switch actuators.

Other fabrication techniques can be employed. The various sense and drive lines, as an example, can be formed from conductive wires into "wireforms". These wireforms can then be snapped into position at the base of appropriately designed switch housings. Instead of wireforms, thin metal strips can be punched to form the correct circuit patterns and similarly snapped into an appropriately designed switch housing. Wire wrapping is another available construction technique. Wires can be wrapped around the base of appropriately designed switch housings to form the coils, and then routed with wires to the next switch position to form the interconnecting network.

Switch Structure Design

Figure 11:
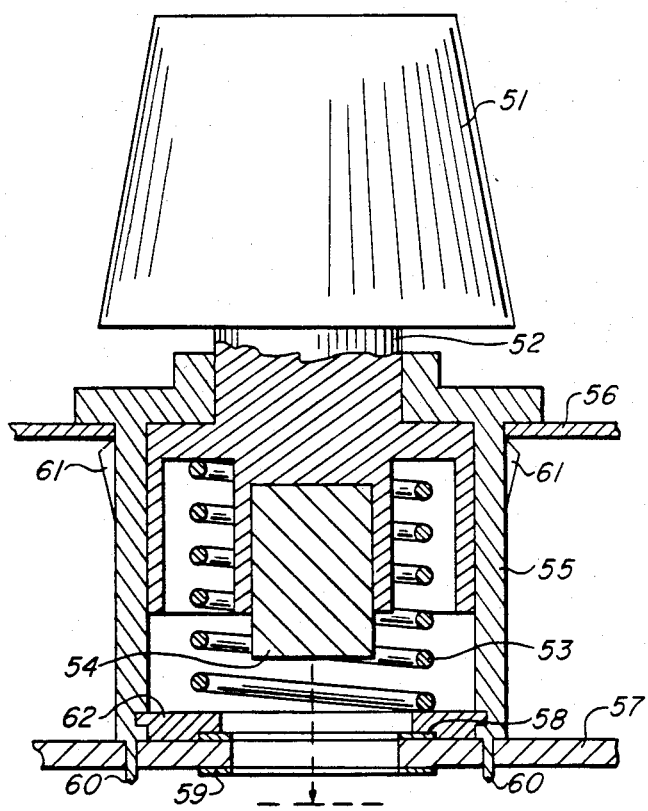
FIG. 11 shows a module switch structure design.
Figure 12:
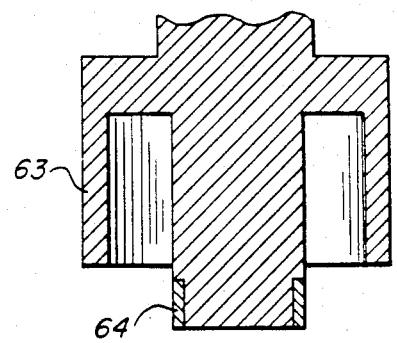
FIG. 12 shows a stem design utilizing a shorted turn.

FIG. 11 shows a switch module design which consists of a keycap or button 51, a keystem 52 which moves in a vertical axis and incorporating a ferrite magnetic core 54, a switch housing 55, a return spring 53, and a snap-in spring retainer 62. The switch housing 55 includes snap in tabs 61 and snaps into a chassis 56, and guide pins 60 locate the housing 55 on the printed circuit board 57. The printed circuit board 57 has primary coils 59 printed on the bottom side and secondary coils 58 printed on the top side of the printed circuit board 57. When the switch is actuated the button 51 is depressed thereby moving the switch stem 52 downwardly such that the magnetic core 54 is positioned inside the primary and secondary coils 58 and 59. FIG. 12 shows a keystem 63 which incorporates an electrically conductive shorted turn 64 instead of a magnetic core.

Interface Circuitry For Electronic Scanning

Figure 13:
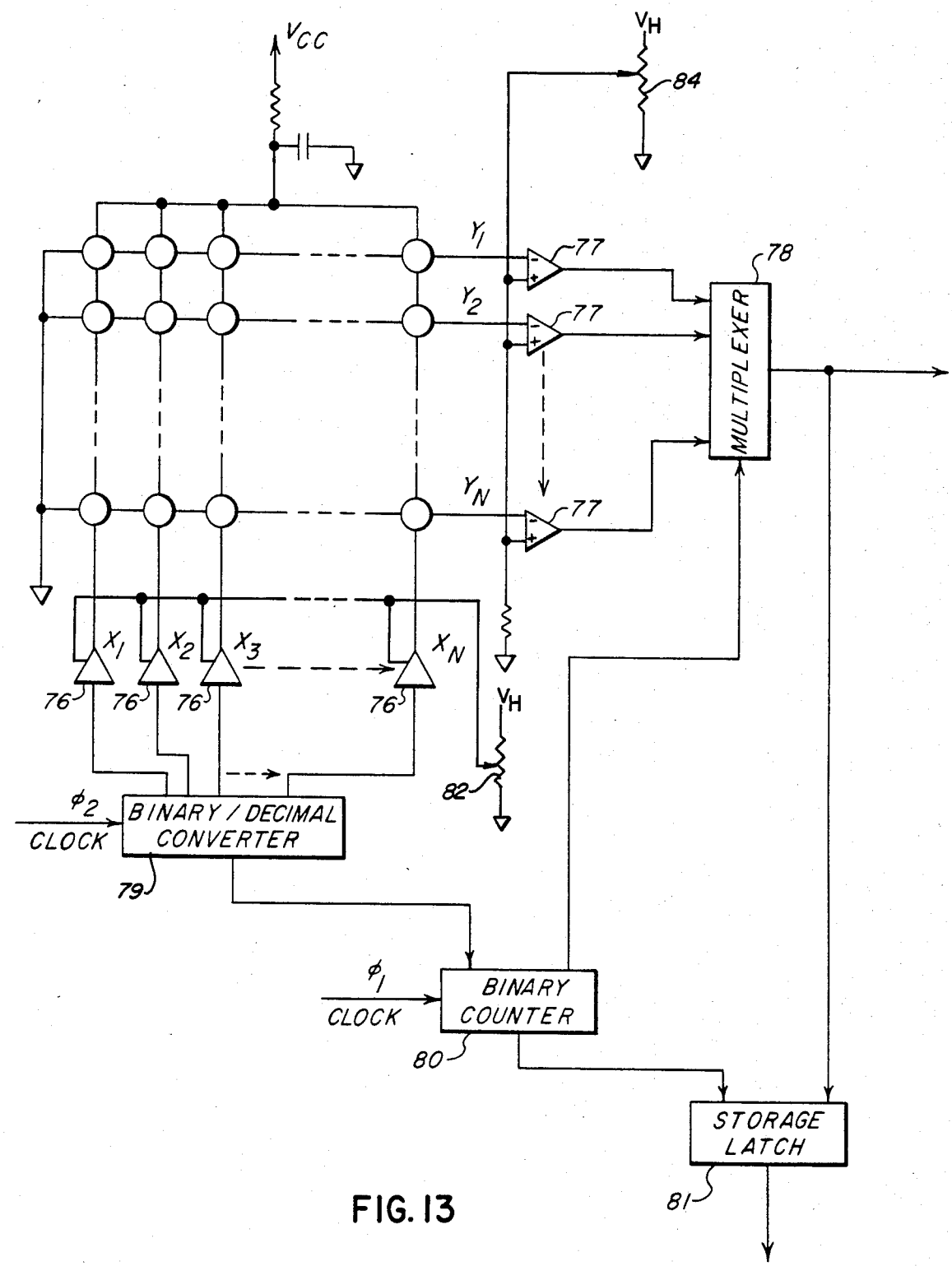
FIG. 13 shows a functional block diagram of a scanning type circuit including implementations of touch control for the associated keyboard.

FIG. 13 shows an array of keyboard switches indicated as circles organized into a two dimensional X-Y matrix and interface circuitry for sequentially scanning through the switches in the matrix. This is a conventional and most effective means for encoding the switches and providing various multi-key rollover functions. The drive lines $X_1$ through $X_N$ are sequentially scanned by current pulses from the binary to decimal converter 79 in response to the least significant bits of timing information contained in binary counter 80, and the sense lines $Y_1$ through $Y_N$ are scanned by the multiplexer 78 in response to the most significant bits of the same timing information. The basic timing information is provided by the binary counter 80 which is advanced by clock pulses. The output from the multiplexer 78 is a single channel signal, and an output pulse will appear for each keyswitch depressed in the matrix in each frame interval. A frame interval is defined as the period required to scan once through the matrix. Each output pulse from the multiplexer 78 will occupy a unique time slot in the frame interval corresponding to a unique code from the binary counter 80. In order to store a code corresponding to the selected switch, the binary code from the binary counter 80 is coupled to a latch 81, and the signal from the multiplexer 78 will transfer the correct code at the proper time to the latch 81.

The binary-to-decimal decoder 79 converts the binary code to decimal outputs which are in turn coupled to current drive amplifiers 76. The sense amplifiers 77 have high input impedance and amplify the signals from the matrix before being coupled to the multiplexer 78. Differential inputs to the sense amplifiers 77 provide a means for coupling in a hysteresis feedback pulse, which is required by an analog switch such as the differential transformer type switch. Additional circuitry is required in order to implement multi-key rollover functions, where more than one keyswitch may be depressed simultaneously, and hysteresis. However, this circuitry is well known to those of ordinary skill in the art and will not be described in detail herein.

Keyboard touch control is provided in accordance with the present invention by varying the amplitude of the scanning pulses which are applied to the drive or X lines and/or by varying the threshold of detection on the sense or Y lines. In the illustrative embodiment, the keyboard touch control is provided by varying the supply voltage to the current drive amplifiers 76 and/or by varying the voltage reference levels of the sense amplifiers 77. In FIG. 13, variable resistors 82 and 84 provide the variable supply voltages required. Of course, other variable voltage supply sources could be provided. The variable voltage levels set the amount of actuator penetration into a primary/secondary winding pair which is required to change the state of the switch from nonoperated to operated. A heavier "touch" on the keyboard is required to provide deeper penetrations of the actuators. Those of ordinary skill in the art will appreciate that the touch control in accordance with the present invention is applicable to any proportional switch design which is scanned to determine switch activation. Accordingly, the touch control of the present application should not be limited to use on keyboards incorporating transformer switch elements.

What is claimed is:
1. A switch array comprising:
a plurality of transformers each having a primary winding and a secondary winding, said transformers being physically arranged to form a matrix comprising horizontal rows and vertical columns, said primary windings lying in a first plane and said secondary windings lying in a second plane parallel and in close proximity to said first plane with each of said primary windings being opposite to and aligned with one of said secondary windings;

first means for interconnecting said primary windings into a plurality of series chains of windings along said vertical columns;

a reference potential;

second means for interconnecting said secondary windings into a plurality of series chains of windings along said horizontal rows with each of said horizontal rows having a first and second output;

third means for interconnecting said first output of each of said horizontal rows together and for connecting said second output of one of said horizontal rows to said reference potential so that signals generated on said second output of the remaining rows is equivalent to the signals present on secondary windings of that row minus the signals present on the secondary windings of said one row; and a plurality of mutual inductance changing actuators associated with and adapted to be selectively positioned relative to all of said plurality of transformers except for the transformers comprising said one row.

2. The switch array of claim 1 wherein said actuators each comprise magnetically permeable material.

3. The switch array of claim 1 wherein said actuators each comprise an electrically conductive element.

4. The switch array of claim 1 wherein said actuators each comprise the combination of a magnetically permeable material and an electrically conductive material.

5. The switch array of claim 1 constructed on a printed circuit board wherein said primary windings are formed on one side of said board and said secondary windings are formed on the other side of said board.

6. The switch array of claim 5 wherein each primary winding and each secondary winding is a single turn winding.

7. A switch array comprising:

a plurality of transformer switches, each of said switches comprising a primary winding in one plane and a secondary winding in a second plane parallel and in close proximity to said first plane, said primary windings being opposite to and axially aligned with said secondary windings and arranged to form crosspoints of a matrix array;

first conducting means for interconnecting said secondary windings in said second plane to form a plurality of series connected winding rows, each of said rows having first and second output terminals;

second conducting means for interconnecting said primary windings in said first plane to form a plurality of series connected winding columns, each of said columns having first and second input terminals;

a reference potential;

third conducting means for interconnecting one output terminal of one of said rows to said reference potential and for interconnecting the other output terminal of said one row to one of said output terminals of the other rows so that an output signal generated on the remaining output terminal of any one of said other rows is equal to signals present on the secondary windings of that row minus signals present on the secondary windings of said one row; and mutual inductance changing means associated with and adapted to be selectively positioned within the primary and secondary windings of all of said switches except for said one row.

8. The switch array of claim 7 wherein the second output terminals of said rows are connected together and the first output terminal of said one row is connected to said reference potential.

9. The switch array of claim 7 wherein the second output terminals of said other rows are connected to the first output terminal of said one row and the second output terminal of said one row is connected to said reference potential, and the primary windings corresponding to said one row are connected so that current flow therein is in the reverse direction compared to the current flow in the remaining primary windings in each of said columns.

10. An electrical switch comprising a transformer having a primary winding which lies in a first plane and a secondary winding which lies in a second plane parallel and in close proximity to said first plane, said windings being positioned such that said primary winding is opposite to and aligned with said secondary winding, and a mutual inductance changing member which is movable from a position outside a common winding bore aligned with said primary and secondary windings to a position within said bore to effect a change in mutual inductance between said primary and secondary windings and the signals coupled thereby to signify a switching operation, said mutual inductance changing member comprising a first and second portion, said first portion being magnetically permeable and said second portion being electrically conductive for providing a maximum range of change in mutual inductance when the switch is operated.

11. An electrical switch comprising a printed circuit board, a transformer having a primary winding printed on one side of said printed circuit board and a secondary winding printed on the other side of said printed circuit board, said primary and secondary windings being aligned with an aperture through said printed circuit board, and coupling changing means operable for selective insertion into said aperture for changing the coupling between said primary and secondary windings whereby the amplitude of the output signal on said secondary winding in response to an input signal on said primary winding is controlled by said coupling changing means to indicate operation or nonoperation of said electrical switch, said coupling changing means comprising a first and second portion, said first portion being magnetically permeable and said second portion being electrically conductive for providing a maximum range of change in coupling when the switch is operated.

12. A switch array comprising:

a plurality of transformer switches each having a primary winding and secondary winding, said transformer switches being physically arranged to form a matrix comprising horizontal rows and vertical columns, said primary windings lying in a first plane and said secondary windings lying in a second plane parallel and in close proximity to said first plane with each of said primary windings being opposite to and aligned with one of said secondary windings;

first means for interconnecting said primary windings into a plurality of series chains of windings along said vertical columns;

second means for interconnecting said secondary windings into a plurality of series chains of windings along said horizontal rows; and a plurality of mutual inductance changing members associated with all of said switches, each mutual inductance changing member being movable from a position outside a common winding bore aligned with the primary and secondary windings of a switch to a position within said bore to effect a change in mutual inductance between the primary and secondary windings and the signals coupled thereby to signify a switching operation;

wherein each of said mutual inductance changing members comprises a first and second portion, said first portion being magnetically permeable and said second portion being electrically conductive for providing a maximum range of change in mutual inductance when the switch is operated.

13. The switch array of claim 12 constructed on a printed circuit board wherein said primary windings are formed on one side of said board and said secondary windings are formed on the other side of said board.

14. The switch array of claim 12 wherein each primary winding and each secondary winding is a single turn winding.

15. The switch array of claim 12 wherein said vertical series chains of windings comprise drive lines and said horizontal series chains comprise sense lines.

16. The switch array of claim 15 wherein a sensing means is associated with each of said sense lines for establishing a predetermined threshold detection level which defines said switching operation.

* * * * *